(12) United States Patent
Sugioka et al.

(10) Patent No.: US 11,211,347 B2
(45) Date of Patent: Dec. 28, 2021

(54) INTEGRATED CIRCUIT STRUCTURES AND METHODS OF FORMING AN OPENING IN A MATERIAL

(71) Applicant: Micron Technology, Inc., Boise, ID (US)

(72) Inventors: Shigeru Sugioka, Hiroshima (JP); Kiyonori Oyu, Tokyo (JP); Hiroshi Toyama, Kanagawa (JP); Jung Chul Park, San Jose, CA (US); Raj K. Bansal, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/060,313

(22) Filed: Oct. 1, 2020

(65) Prior Publication Data

US 2021/0020592 A1 Jan. 21, 2021

Related U.S. Application Data

(62) Division of application No. 15/981,599, filed on May 16, 2018, now Pat. No. 10,847,482.

(51) Int. Cl.
*H01L 23/00* (2006.01)
*G03F 1/54* (2012.01)

(52) U.S. Cl.
CPC ............. *H01L 24/02* (2013.01); *G03F 1/54* (2013.01); *H01L 2224/0235* (2013.01);
(Continued)

(58) Field of Classification Search
CPC .......... H01L 24/02; H01L 2224/02375; H01L 2224/0236; H01L 2224/02313; H01L 2224/02381; H01L 2224/0235
See application file for complete search history.

(56) References Cited

U.S. PATENT DOCUMENTS

| 2003/0153172 A1 | 8/2003 | Yajima et al. |
| 2017/0040267 A1 | 2/2017 | Yajima |

(Continued)

*Primary Examiner* — Wasiul Haider
(74) *Attorney, Agent, or Firm* — Wells St. John P.S.

(57) ABSTRACT

In some embodiments, a method of forming an opening in a material comprises forming RIM over target material. Radiation is impinged onto the RIM through a masking tool over a continuous area of the RIM under which a target-material opening will be formed. The masking tool during the impinging allows more radiation there-through onto a mid-portion of the continuous area of the RIM in a vertical cross-section than onto laterally-opposing portions of the continuous area of the RIM that are laterally-outward of the mid-portion of the RIM in the vertical cross-section. After the impinging, the RIM is developed to form a RIM opening that has at least one pair of laterally-opposing ledges laterally-outward of the mid-portion of the RIM in the vertical cross-section elevationally between a top and a bottom of the RIM opening. The developed RIM is used as masking material while etching the target material through the RIM opening to form the target-material opening to have at least one pair of laterally-opposing ledges laterally-outward of a mid-portion in the target-material opening in the vertical cross-section elevationally between a top and a bottom of the target-material opening. Other aspects and constructions independent of manufacture are disclosed.

6 Claims, 15 Drawing Sheets

(52) U.S. Cl.
CPC ............... *H01L 2224/0236* (2013.01); *H01L 2224/02313* (2013.01); *H01L 2224/02375* (2013.01); *H01L 2224/02381* (2013.01)

(56) References Cited

U.S. PATENT DOCUMENTS

2019/0074305 A1* 3/2019 Gong ................... H01L 21/3212
2019/0081087 A1* 3/2019 Yuan .................... H01L 27/127

* cited by examiner

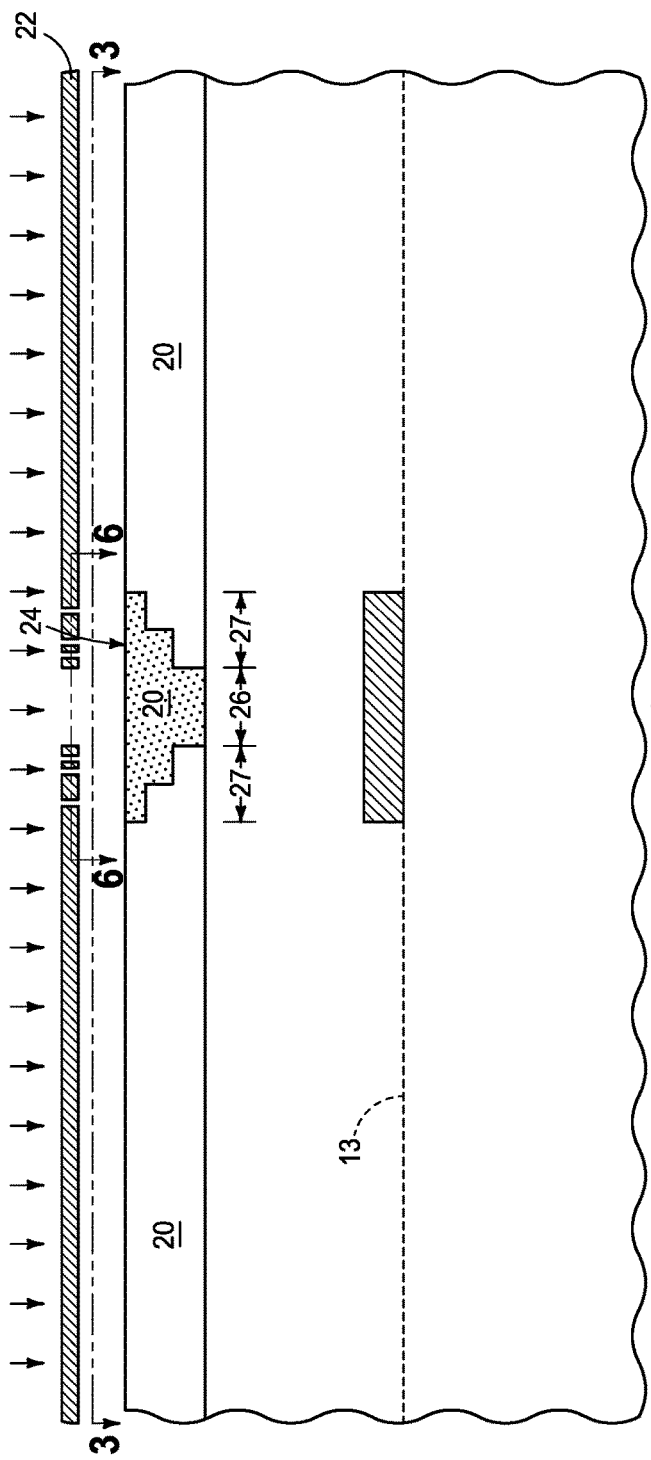
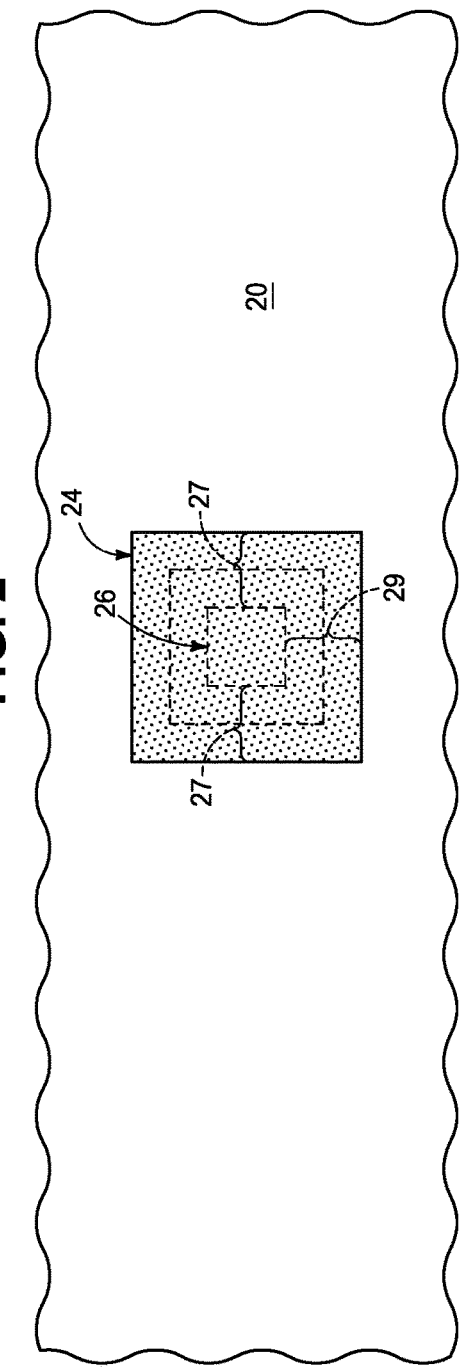

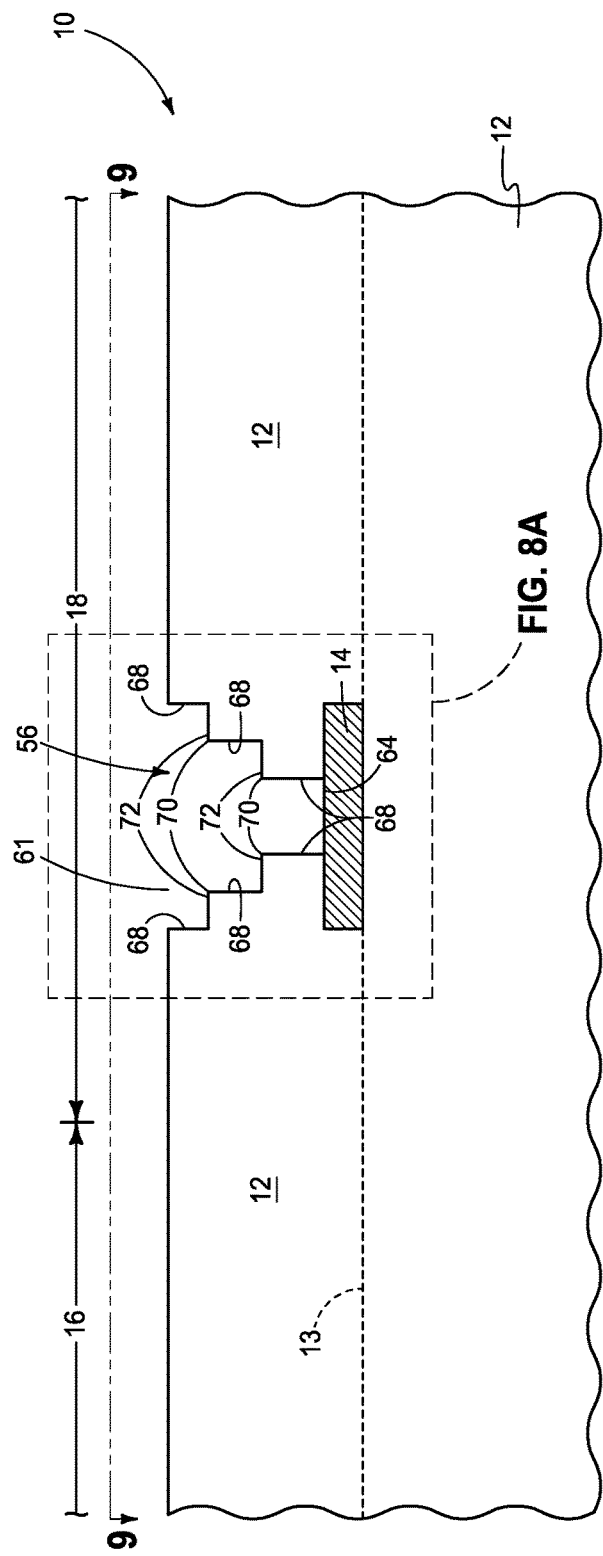
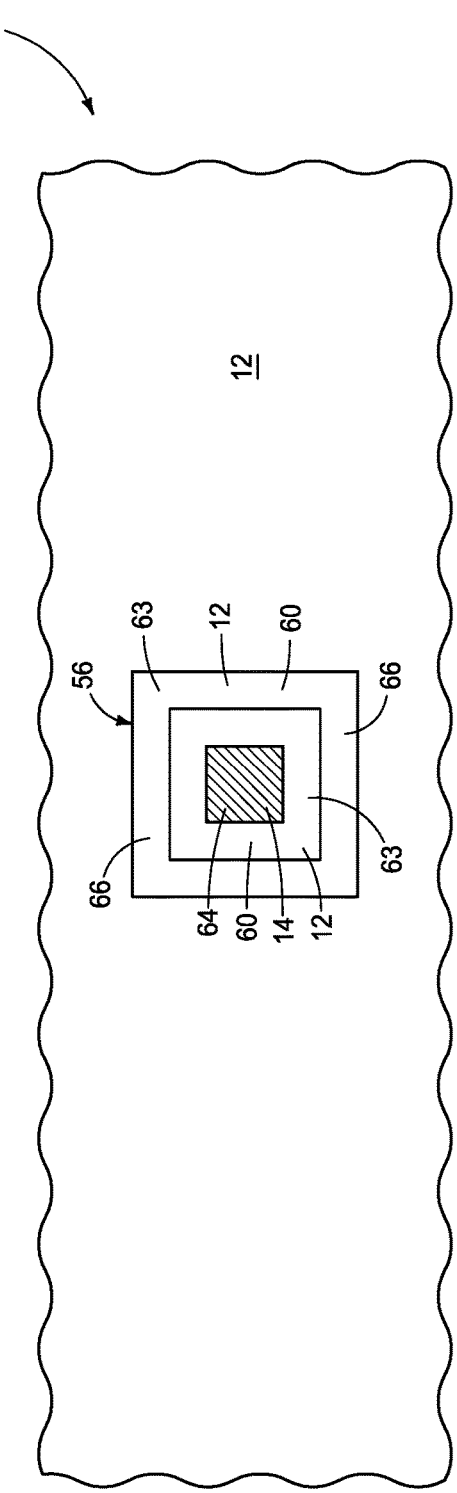
FIG. 8
FIG. 9

INTEGRATED CIRCUIT STRUCTURES AND METHODS OF FORMING AN OPENING IN A MATERIAL

RELATED PATENT DATA

This patent resulted from a divisional application of U.S. patent application Ser. No. 15/981,599, filed May 16, 2018, entitled "Integrated Circuit Structures And Methods Of Forming An Opening In A Material", naming Shigeru Sugioka, Kiyonori Oyu, Hiroshi Toyama, Jung Park Chul, and Raj K. Bansal as inventors, the disclosure of which is incorporated by reference.

TECHNICAL FIELD

Embodiments disclosed herein pertain to integrated circuit structures and to methods of forming an opening in a material.

BACKGROUND

Integrated circuit structures typically comprise a redistribution layer that is an upper layer of integrated circuitry that comprises metal material and that makes input/output nodes for the integrated circuitry available in or at other locations. Some embodiments of the invention disclosed herein are related to conductive lines that are formed from or comprise a part of a redistribution layer. Some embodiments of the invention disclosed herein are related to methods of forming an opening in a material, for example in a dielectric material that is above a redistribution layer.

BRIEF DESCRIPTION OF THE DRAWINGS

FIG. 2 is a view of the FIG. 1 substrate, and of a diagrammatic masking tool, at a processing step subsequent to that shown by FIG. 1.

FIG. 3 is a top view the FIG. 2 substrate looking downwardly from line 3-3 in FIG. 2.

FIG. 8 is a view of the FIG. 4 substrate at a processing step subsequent to that shown by FIG. 4.

FIG. 9 is a top view the FIG. 8 substrate looking downwardly from line 9-9 in FIG. 8.

DETAILED DESCRIPTION OF EXAMPLE EMBODIMENTS

Embodiments of the invention encompass methods of forming an opening in a material, for example as might be used in the formation of an access opening to a redistribution layer of an integrated circuit. Embodiments of the invention also encompass an integrated circuit structure independent of method of manufacture. Example embodiments are initially described with reference to FIGS. 1-15.

Figure 1:
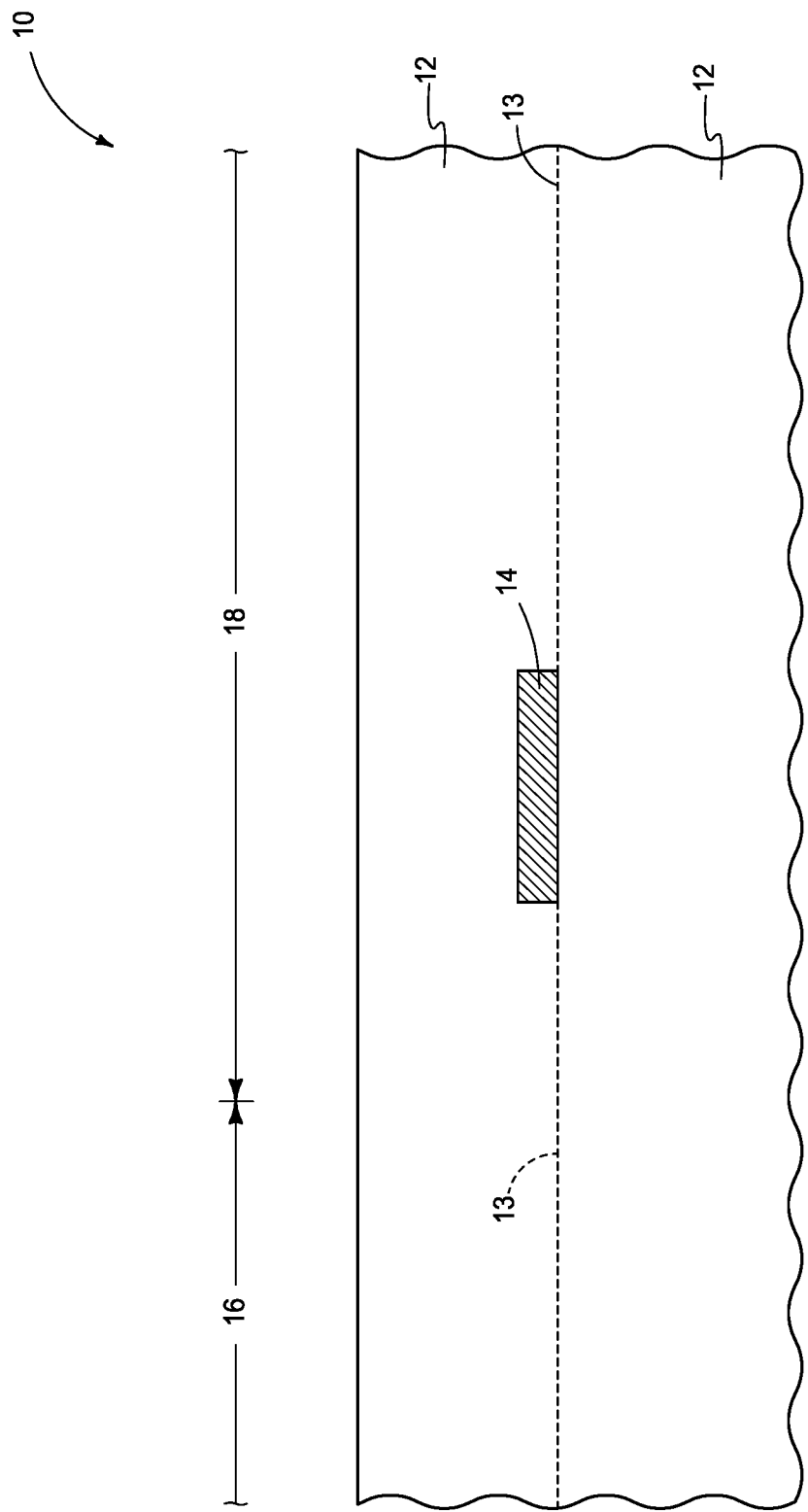
FIG. 1 is a diagrammatic cross-sectional view of a portion of a substrate in process in accordance with an embodiment of the invention.

Referring to FIG. 1, a substrate construction 10 in process of a method in accordance with an embodiment of the invention is shown. Substrate construction 10 may comprise a base substrate (not shown) that may include any one or more of conductive/conductor/conducting (i.e., electrically herein), semiconductive/semiconductor/semiconducting, or insulative/insulator/insulating (i.e., electrically herein) materials. Various materials would typically be formed above the base substrate, with the base substrate and such materials comprising any existing or later-developed integrated circuitry. Substrate construction 10 comprises insulating material 12 (e.g., doped or undoped silicon dioxide) above integrated circuitry. The integrated circuitry has some upper conductive node 14 and is otherwise not material to this disclosure. Example upper conductive node 14 is for simplicity shown as a conductive block of material (e.g., metal material, such as TiN) that may be part of a conductive line or a contact pad that electrically couples with the integrated circuitry there-below (not shown). A dashed line 13 is shown within insulating material 12 and may have been a surface upon which upper conductive node 14 was formed, followed by deposition of more or other insulating material 12 there-above.

Materials may be aside, elevationally inward, or elevationally outward of the FIG. 1—depicted materials. For example, other partially or wholly fabricated components of integrated circuitry may be provided somewhere above, about, or within the base substrate (not shown). Control and/or other peripheral circuitry for operating components within an array (e.g., an array of memory cells) may also be fabricated and may or may not be wholly or partially within an array or sub-array. Further, multiple sub-arrays may also be fabricated and operated independently, in tandem, or otherwise relative one another. In this document, a "sub-array" may also be considered as an array. By way of example, substrate construction 10 may include an array area or region 16 and an adjacent peripheral circuitry region 18 containing circuitry for operating, controlling, and/or accessing circuitry within array region 16. Example upper conductive node 14 is shown in peripheral circuitry region 18 and may be considered as part of the peripheral circuitry. Alternately, as an example, the upper conductive node may be part of other circuitry, including circuitry within an array region, and may be directly above such other circuitry.

Referring to FIGS. 2 and 3, radiation-imageable material (RIM) 20 has been formed over insulating material 12. RIM 20 may be any existing or later-developed material that can be imaged by any existing or later-developed/discovered radiation, with photoresist being one example. Insulating material 12 in accordance with method embodiments may more generically and broadly be considered as target material 12 in which a target-material opening (not shown in FIG. 2 or 3) will be formed. Method embodiments of the invention encompass forming of an opening in any material referred to as target material due to such material being targeted for processing in accordance with the methods disclosed herein.

Radiation (diagrammatically illustrated as vertical down-arrows in FIG. 2) is impinged onto RIM 20 through a masking tool 22 (e.g., a mask or reticle) over some continuous area 24 of RIM 20 under which the target-material opening will be formed. Masking tool 22 during the impinging allows more radiation there-through onto a mid-portion 26 of continuous area 24 of RIM 20 in a vertical cross-section (e.g., the plane of the page upon which FIG. 2 lies) than onto laterally-opposing portions 27 of continuous area 24 of RIM 20 that are laterally-outward of mid-portion 26 in the vertical cross-section. In one embodiment and as shown in FIG. 3, a portion 29 may be an annular portion of continuous area 24 that is peripheral to example mid-portion 26, and which includes laterally-opposing portions 27.

Figure 4:
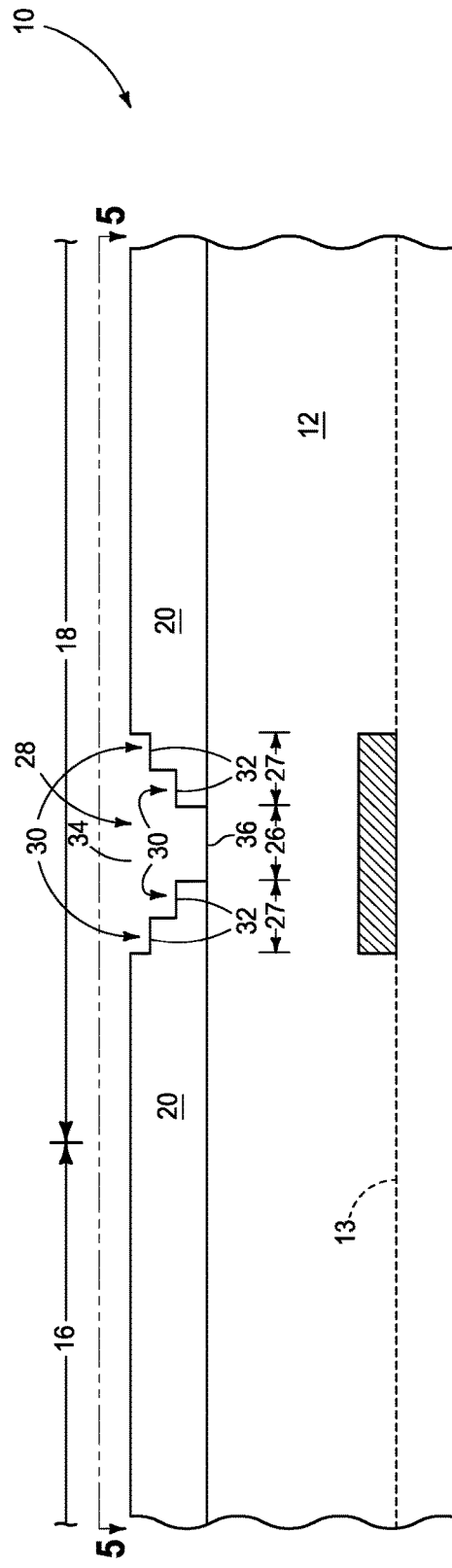
FIG. 4 is a view of the FIG. 2 substrate at a processing step subsequent to that shown by FIG. 2.
Figure 5:
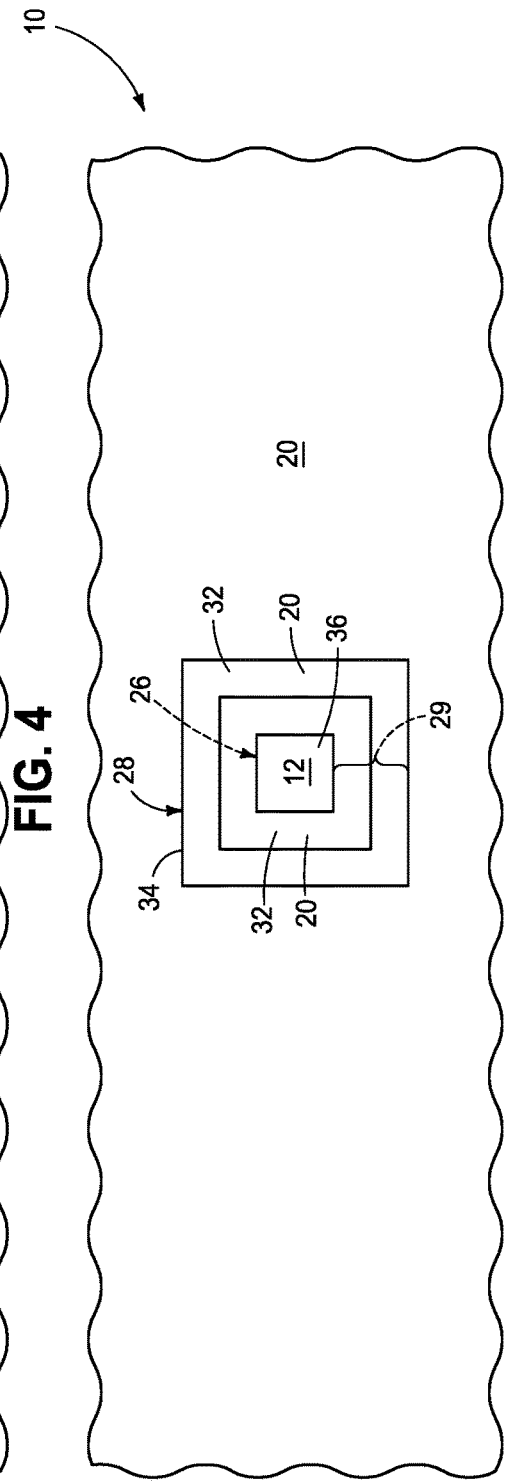
FIG. 5 is a top view the FIG. 4 substrate looking downwardly from line 5-5 in FIG. 4.

Referring to FIGS. 4 and 5, RIM 20 has been developed to form a RIM opening 28 that has at least one pair 30 of laterally-opposing ledges 32 laterally-outward of mid-portion 26 of RIM 20 in the vertical cross-section elevationally between a top 34 and a bottom 36 of RIM opening 28. More than one pair of such ledges may be formed, with two pairs 30 being shown as having been formed from such developing. Additionally, in one embodiment and as shown, such developing of RIM 20 to form RIM opening 28 may form one or more ledges 32 to be an annular ledge 32 in annular portion 29 of continuous area 24 elevationally between top 34 and bottom 36 of RIM opening 28. Regardless, more or less than two pairs of ledges (not shown) may be formed in RIM opening 28.

Any existing or later-developed masking tool that will allow a mid-portion of a continuous area of the RIM to get more radiation than laterally-opposing portions that are laterally-outward of the mid-portion may be used. FIG. 2 diagrammatically shows masking tool 22 as having a single large opening there-through over all of mid-portion 26. Two spaced smaller openings are shown over first laterally-opposing portions immediately-laterally adjacent mid-portion 26, with second lateral-opposing portions immediately laterally-adjacent the first laterally-opposing portions having only a single opening there-through. Such is so-shown in FIG. 2 diagrammatically due to limitations in the drawing scale of FIG. 2.

Figure 6:
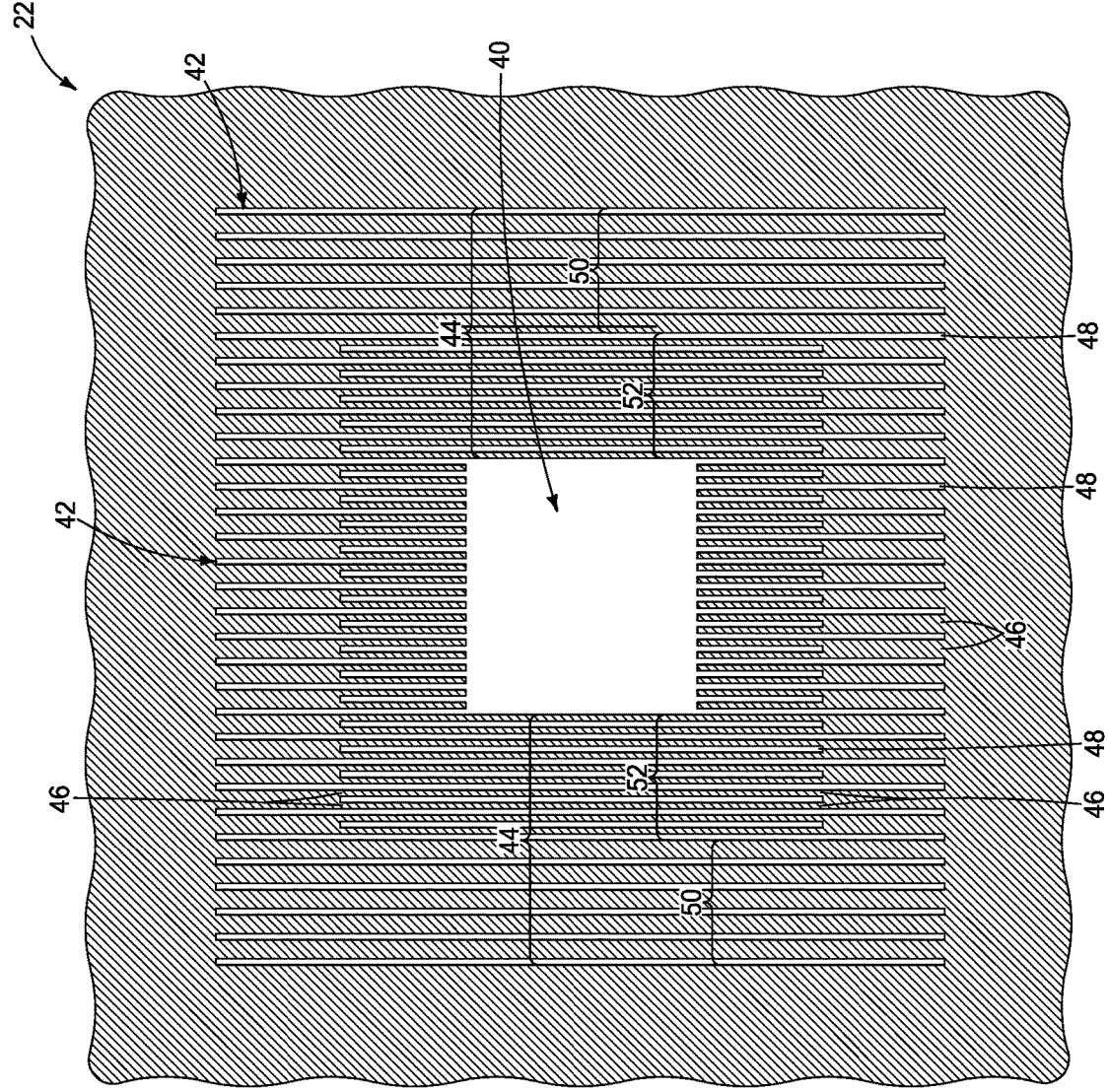
FIG. 6 is an enlarged and more detailed sectional view of a portion of the masking tool of FIG. 2, taken through line 6-6 in FIG. 2.

FIG. 6 shows an enlarged view of a more-likely and possible portion of a masking tool 22 usable in accordance with method embodiments of the invention. Masking tool 22 has a mid-portion 40 of a continuous area 42 of masking tool 22 in a horizontal cross-section (e.g., the plane of the page upon which FIG. 6 lies) and has laterally-opposing portions 44 of continuous area 42 that are laterally-outward of mid-portion 40. Laterally-opposing portions 44 have spaced elongated linear strips 46 of radiation-blocking material (e.g., chrome) having an elongated radiation-transmissive region 48 (e.g., void space or solid radiation-transmissive material) between immediately-adjacent linear strips 46 in the horizontal cross-section. Example continuous area 42 may be considered as encompassed or defined by mid-portion 40, linear strips 46, and radiation-transmissive regions 48. In one embodiment and as shown, radiation-blocking strips 46 and radiation-transmissive regions 48 are elongated straight linear in the horizontal cross-section. In one embodiment and as shown, masking tool 22 may be considered as having two sets 50, 52 of laterally-opposing portions of continuous area 42 that are laterally-outward of mid-portion 40. Each of laterally-opposing portions of sets 50, 52 have spaced linear strips 46 of radiation-blocking material having one of radiation-transmissive regions 48 between immediately-adjacent linear strips 46 in the horizontal cross-section. Radiation-transmissive regions 48 are greater in number in the laterally-inner laterally-opposing portions of the two sets (e.g., in set 52 as compared to set 50). In one embodiment and as shown, radiation-blocking strips 46 in each of two sets 50, 52 have the same and constant width relative one another intra-set in the horizontal cross-section.

Figure 7:
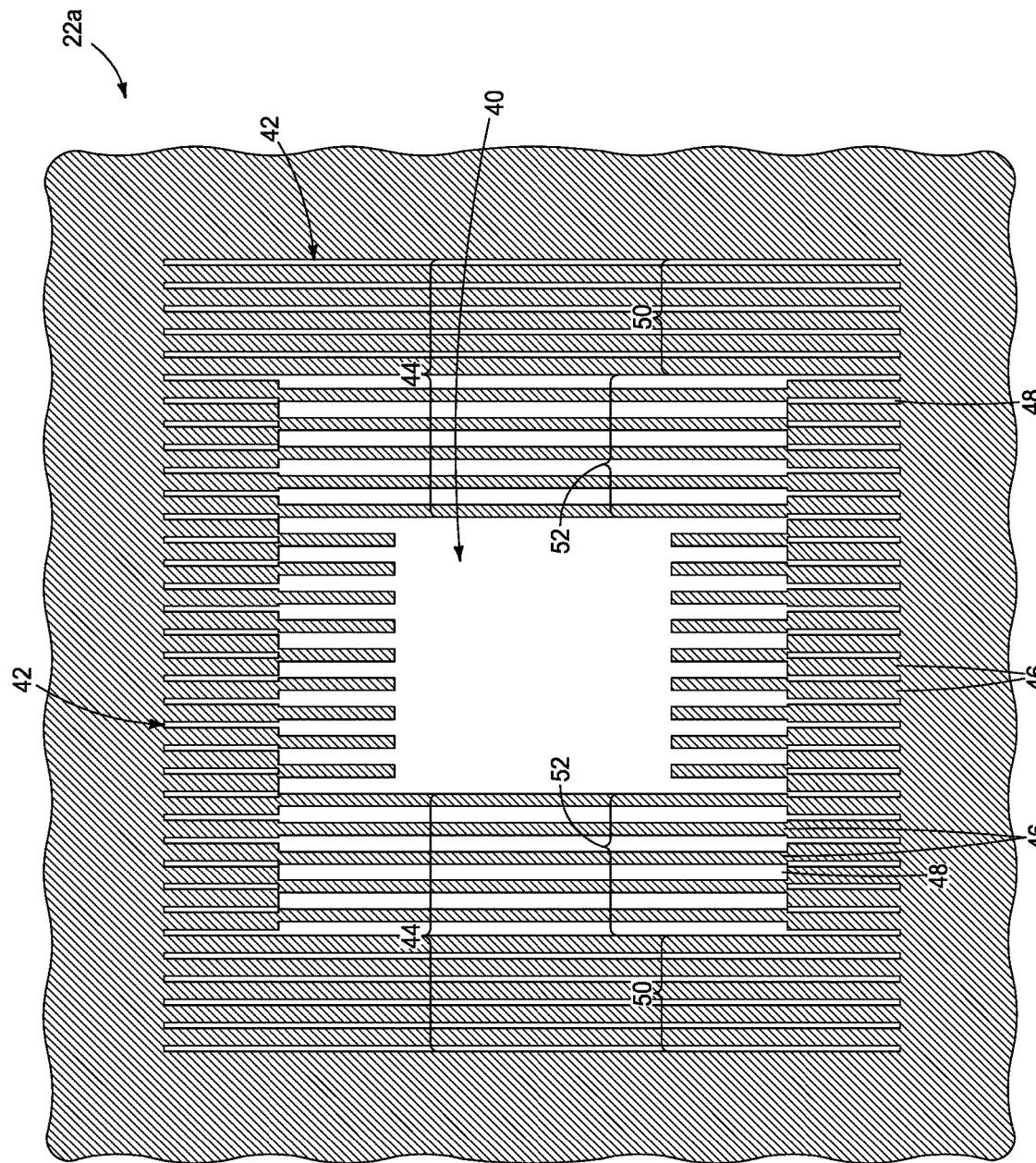
FIG. 7 is an enlarged sectional view of an alternate embodiment masking tool to that shown in FIG. 6.

An alternate example masking tool 22a usable in accordance with method embodiments of the invention is shown in FIG. 7. Like numerals from FIG. 6 have been used. Radiation-transmissive regions 48 are the same in number in the laterally-inner laterally-opposing portions of the two sets (e.g., in each of sets 50 and 52), with regions 48 in the laterally-inner laterally-opposing portions of set 52 being wider than in set 50. In one such embodiment and as shown, radiation-blocking strips 46 in each of two sets 50, 52 have the same and constant width relative one another intra-set and different width relative one another inter-set.

FIGS. 6 and 7, by way of example only, show example masking tools that may be used in accordance with method embodiments of the invention. Other existing or later-developed masking tools may be used (e.g., using half-tone techniques and/or half-tone masking tools). For example, example tools 22 and 22a each have all of their strips 46 and regions/spaces 48 longitudinally aligned in one direction. Alternately, either may have some of their strips 46 and regions/spaces 48 angled relative to others of their strips 46 and regions/spaces 48 (e.g., orthogonally and not shown). For example, and by way of examples only, opposing lateral sides of continuous area 42 of either tool 22 and/or 22a could have their strips and region/spaces oriented orthogonally (e.g., horizontally in either of FIG. 6 or 7) relative tops and bottoms of continuous area 42 (e.g., regardless of same or different space, width, and/or pitch).

Figure 8A:
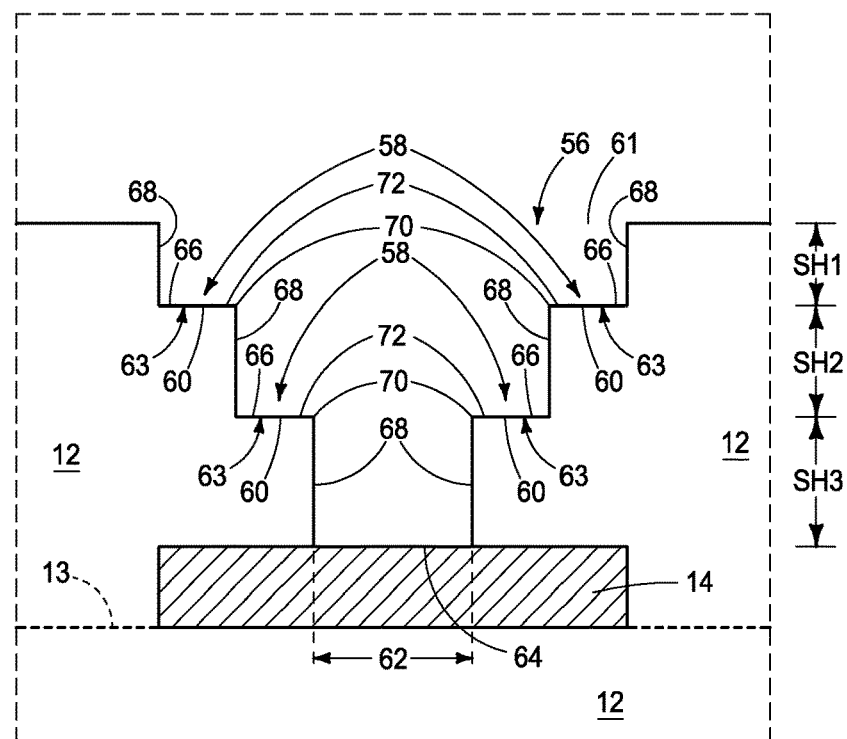
FIG. 8A is an enlargement of a portion of FIG. 8.

Referring to FIGS. 8, 8A, and 9, developed RIM 20 (not shown) has been used as masking material while etching target material 12 through RIM opening 28 (not shown) to form a target-material opening 56 to have at least one pair 58 (FIG. 8A, with two pairs 58 being shown) of laterally-opposing ledges 60 laterally-outward of a mid-portion 62 in target-material opening 56 in the vertical cross-section elevationally between a top 61 and a bottom 64 of target-material opening 56. In one embodiment and as shown, target-material opening 56 has at least one annular ledge 63 (FIG. 9) radially-outward of mid-portion 62, with two such annular ledges 63 being shown. RIM 20 may be wholly or partially removed while etching target material 12, and/or removed after the etching of target material 12 has been completed.

In one embodiment and as shown, the at least one annular ledge 63 has an upper surface 66 at least a majority of which in a vertical cross-section radially through the at least one annular ledge 63 (e.g., the plane of the page upon which FIGS. 8 and 8A lie) is straight linear. Regardless and in one embodiment and as shown, at least some portion of upper surface 66 in the vertical cross-section is horizontal or within 10° of horizontal, and in one embodiment is horizontal or within 5° of horizontal, and in one embodiment with the portion being straight linear in the vertical cross-section.

In one embodiment, the at least one annular ledge 63 has a radially-inner upper corner 70, an upper surface 72 immediately-adjacent radially-inner upper corner 70, and a side surface 68 extending downwardly from upper surface 72 at radially-inner upper corner 70 (all in the vertical cross-section as shown). In one such embodiment, upper surface 72 and side surface 68 immediately-adjacent upper corner 70 are straight linear in the vertical cross-section. In one embodiment, at least a majority (in one embodiment at least 90%, and in one embodiment all) of sidewalls 68 of opening 56 above and below the at least one annular ledge 63 are straight linear and vertical or within 5° of vertical in the vertical cross-section.

In one embodiment and as shown, multiple annular ledges 63 respectively have a maximum step height SH* (FIG. 8A, and shown as SH1, SH2, and SH3, and generically referred to separately or individually as SH*) from an adjacent lower surface 66 to an uppermost surface 66 of the respective annular ledge, with the maximum step height SH* of an upper of the multiple annular ledges being less than the maximum step height SH* of a lower of the multiple annular ledges that is immediately-adjacent the upper annular ledge (e.g., one or both of SH1 being less than SH2 or SH2 being less than SH3).

Figure 8B:
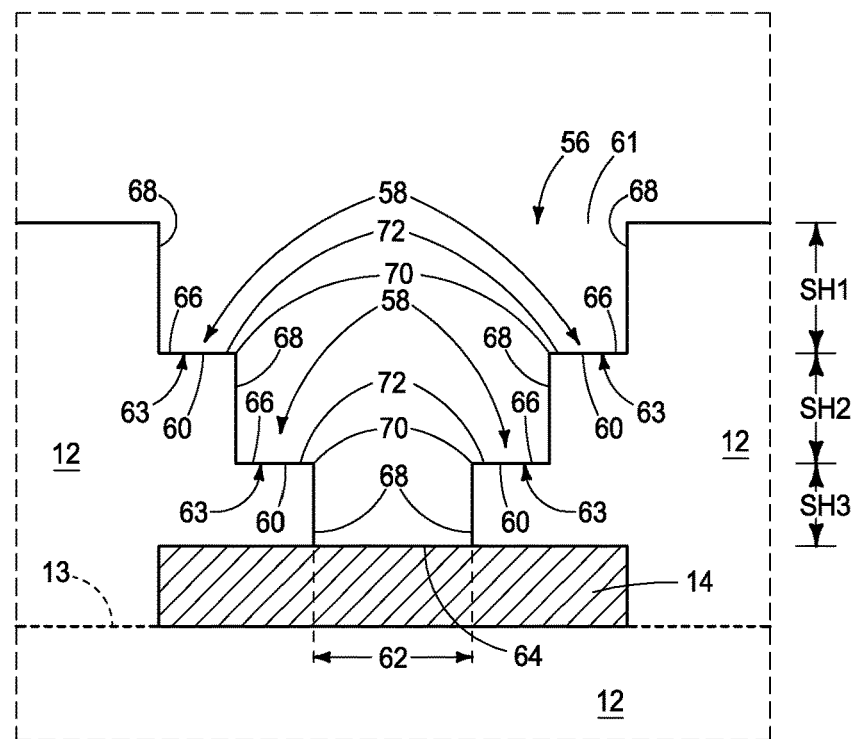
FIG. 8B is an alternate embodiment to that of FIG. 8A.

In one embodiment and as shown, there are two and only two of annular ledges 63 elevationally between the top and the bottom of the opening. The two annular ledges respectively have a maximum step height SH* from an adjacent lower surface 66 to an uppermost surface 66 of the respective annular ledge, with the maximum step height SH* of an upper of the two annular ledges being less than the maximum step height SH* of a lower of the two annular ledges. Insulating material 12 has an upper surface immediately-radially-adjacent the opening, with the maximum step height SH* between the upper annular ledge and the upper surface being less than the maximum step height SH* of the upper annular ledge (e.g., SH1 being less than SH2 which is less than SH3 as shown). An alternate example embodiment in comparison to FIG. 8A is shown in FIG. 8B. In FIG. 8B, the multiple annular ledges respectively also have a maximum step height SH* from an adjacent lower surface 66 to an uppermost surface 66 of the respective annular ledge, but with the maximum step height SH* of an upper of the multiple annular ledges being more than the maximum step height SH* of a lower of the multiple annular ledges that is immediately-adjacent the upper annular ledge (e.g., SH1 being more than SH2 which is more than SH3 as shown).

Figure 10:
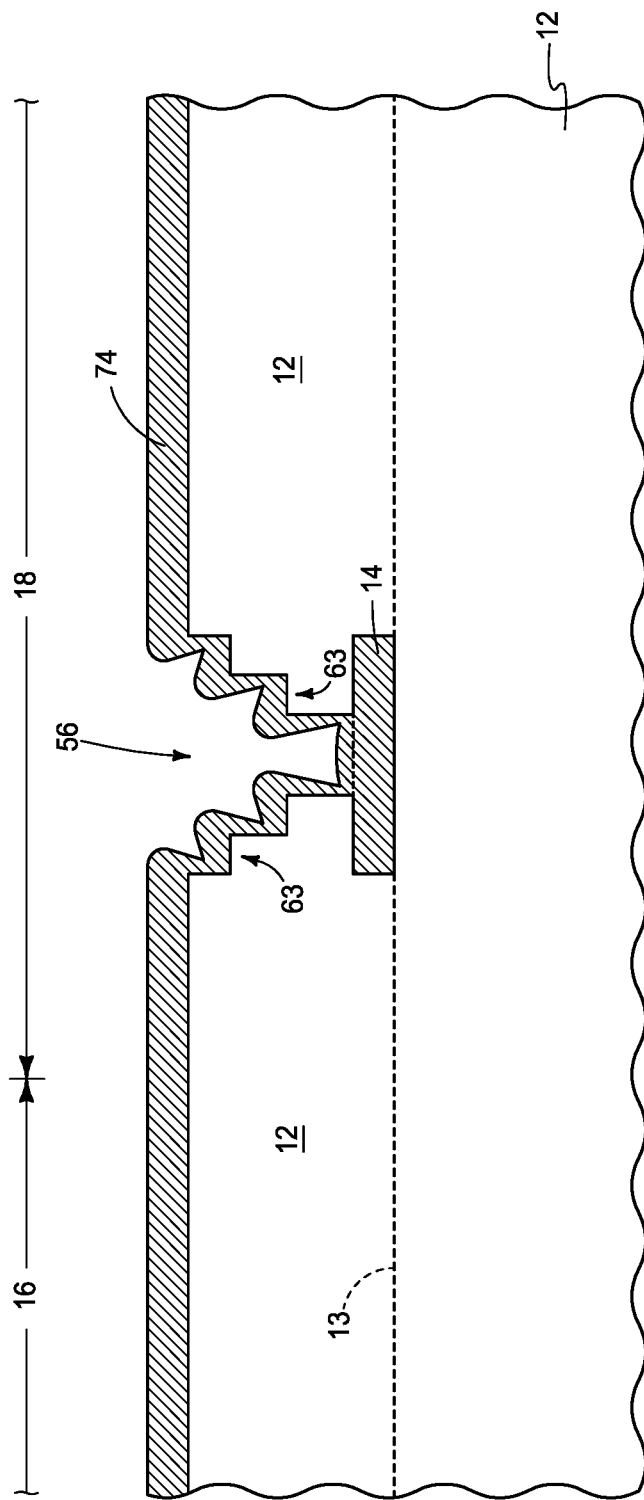
FIG. 10 is a view of the FIG. 8 substrate at a processing step subsequent to that shown by FIG. 8.

Referring to FIG. 10, a redistribution layer 74 (i.e., an upper layer of integrated circuitry that comprises metal material and that makes input/output nodes for the integrated circuitry available in or at other locations, and hereafter referred to as RDL) has been formed above insulating material 12 and into opening 56 over the at least one annular ledge 63 and is directly electrically coupled to upper conductive node 14. RDL 74 may be the same or of different composition from that of upper conductive node 14.

Figure 11:
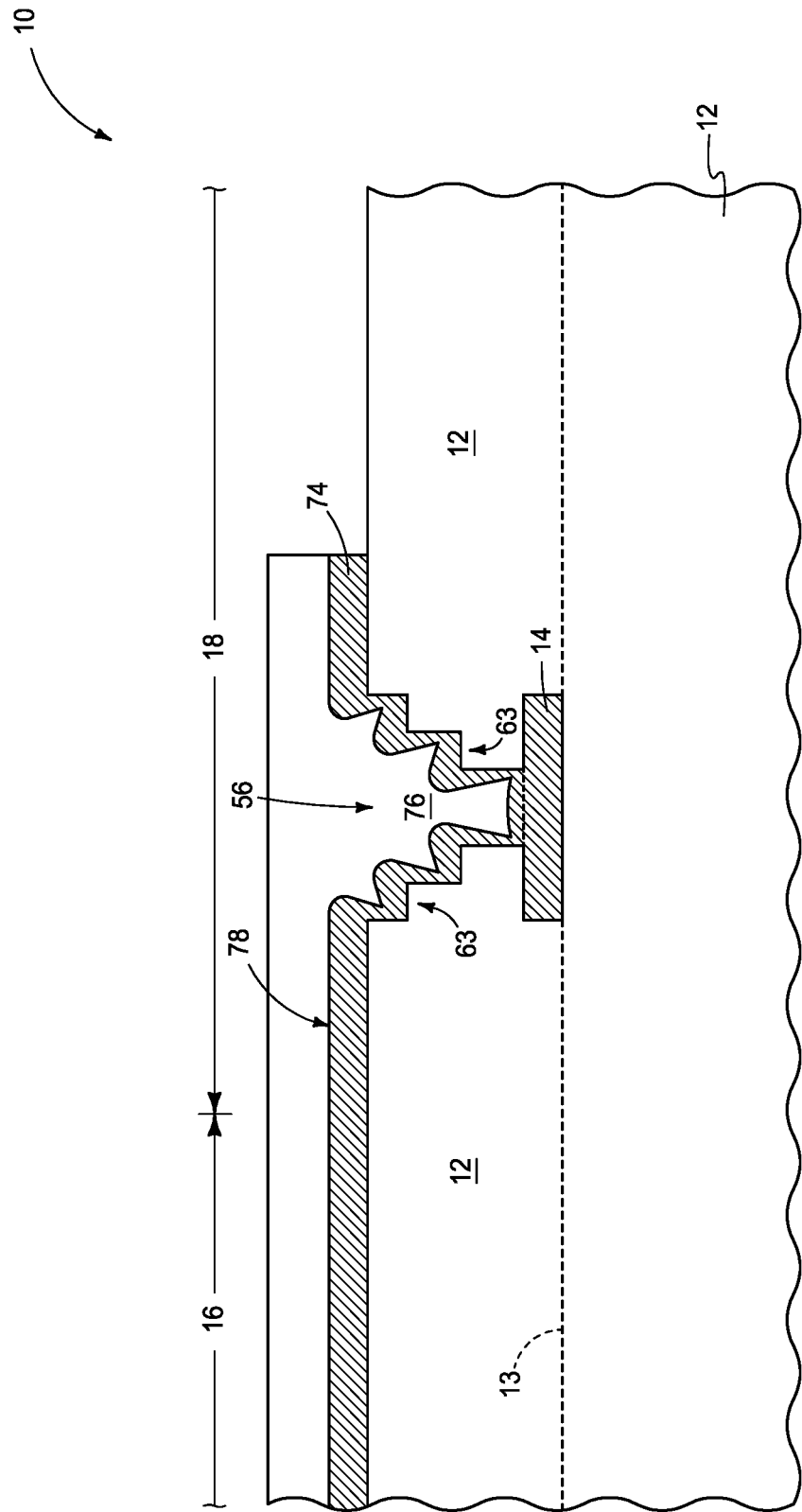
FIG. 11 is a view of the FIG. 10 substrate at a processing step subsequent to that shown by FIG. 10.
Figure 12:
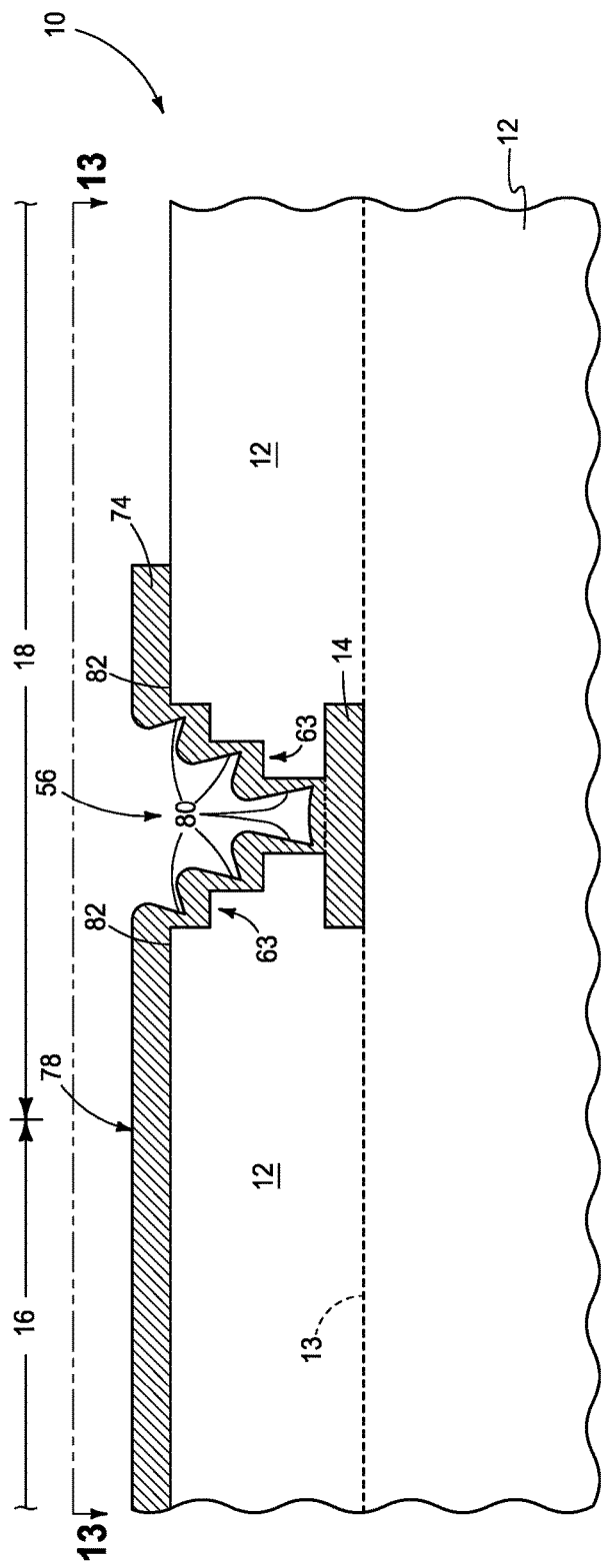
FIG. 12 is a view of the FIG. 11 substrate at a processing step subsequent to that shown by FIG. 11.
Figure 13:
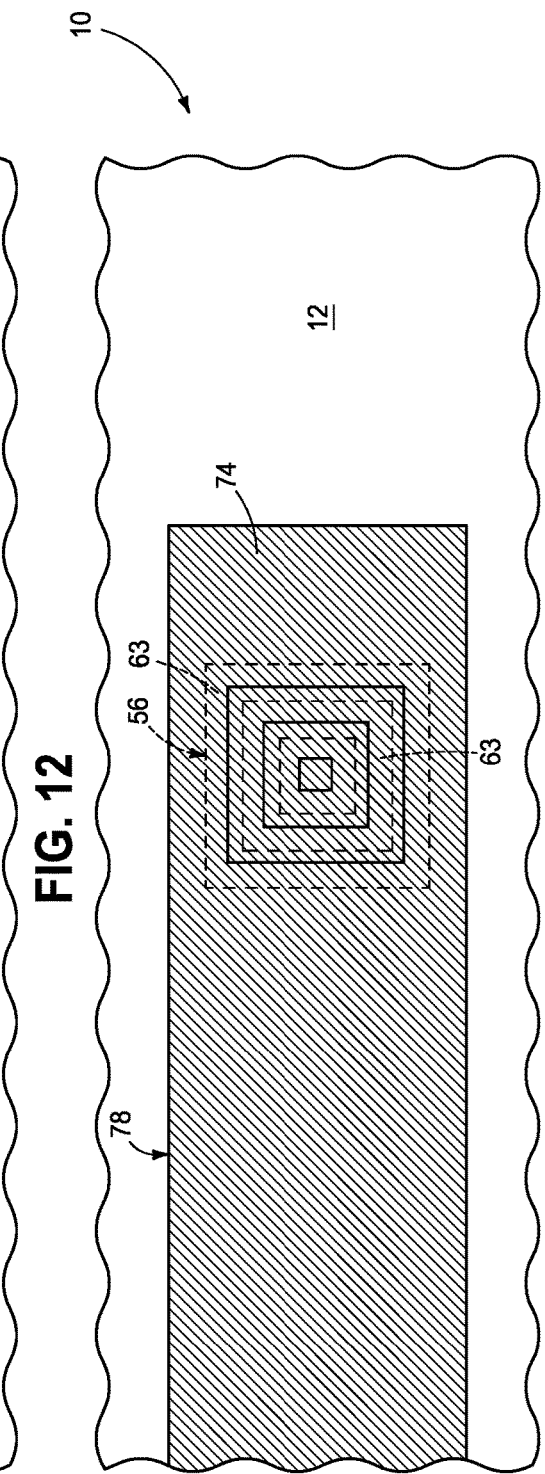
FIG. 13 is a top view the FIG. 12 substrate looking downwardly from line 13-13 in FIG. 12.

Referring to FIG. 11, masking material 76 (e.g., photoresist) has been formed atop RDL 74. Thereafter, masking material 76 has been patterned as shown, and RDL material 74 has been etched using masking material 76 as a mask to form an RDL conductive line 78 from RDL 74. In one embodiment and as shown, all RDL conductive material 74 of conductive RDL line 78 that is in opening 56 less-than-fills opening 56. FIGS. 12 and 13 show example RDL line 78 after removal of masking material 76.

In one embodiment and as shown, metal material 74 of RDL conductive line 78 within opening 56 has opposed laterally-inner surfaces 80 in the vertical cross-section, with at least some portions of such being straight linear in the vertical cross-section. Insulating material 12 in the vertical cross-section in the depicted embodiment has substantially planar upper surfaces 82 (e.g., which are horizontal) immediately-adjacent opening 56. In one embodiment and as shown, angles of the respective straight-linear portions of laterally-inner surfaces 80 relative to planar upper surface 82 are obtuse. Such may occur, by way of example only, when RDL 74 is deposited by physical vapor deposition (PVD) and may not occur, or be less likely to occur, if deposited by atomic layer deposition or chemical vapor deposition.

Figure 14:
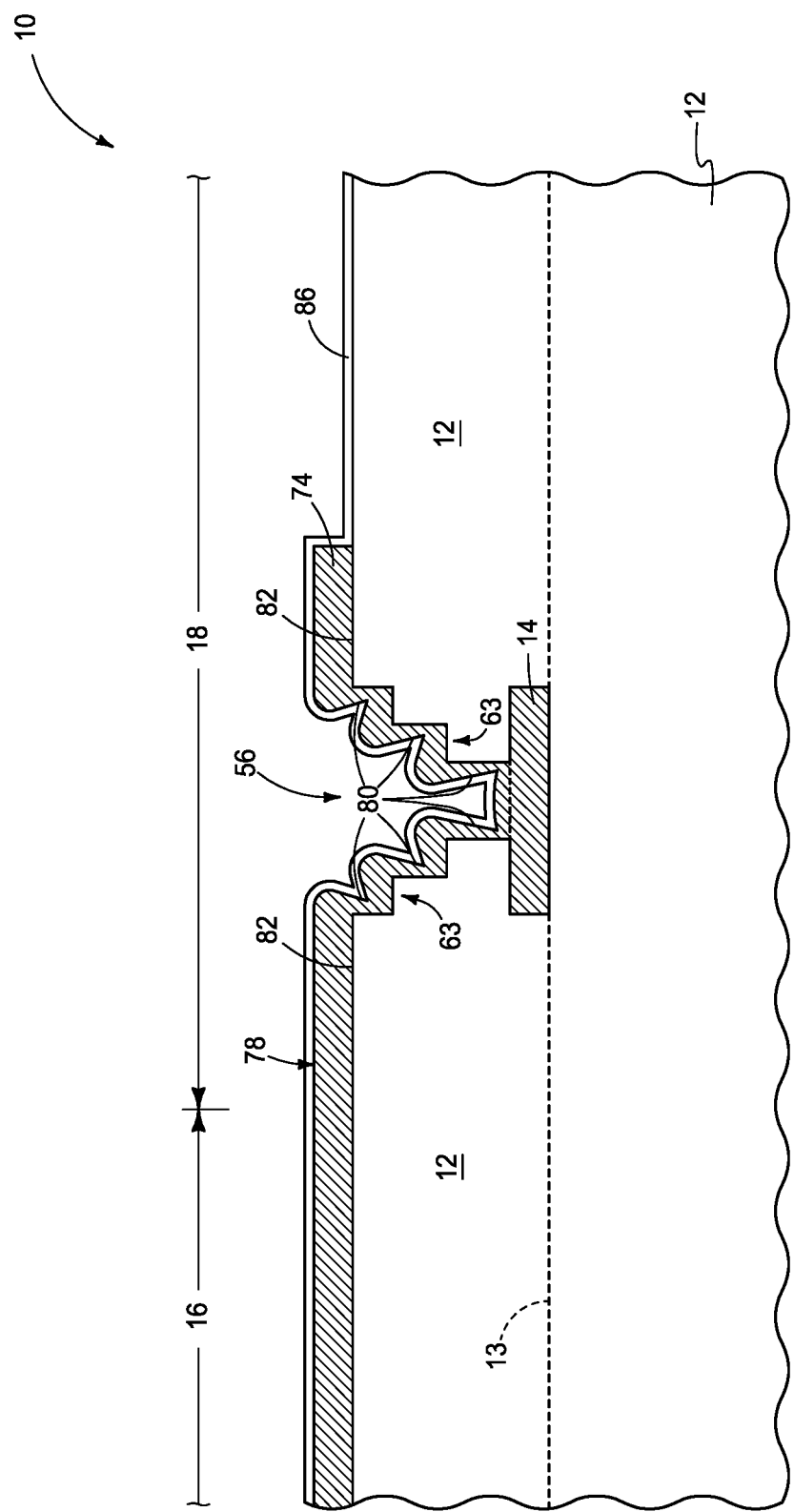
FIG. 14 is a view of the FIG. 12 substrate at a processing step subsequent to that shown by FIG. 12.
Figure 15:
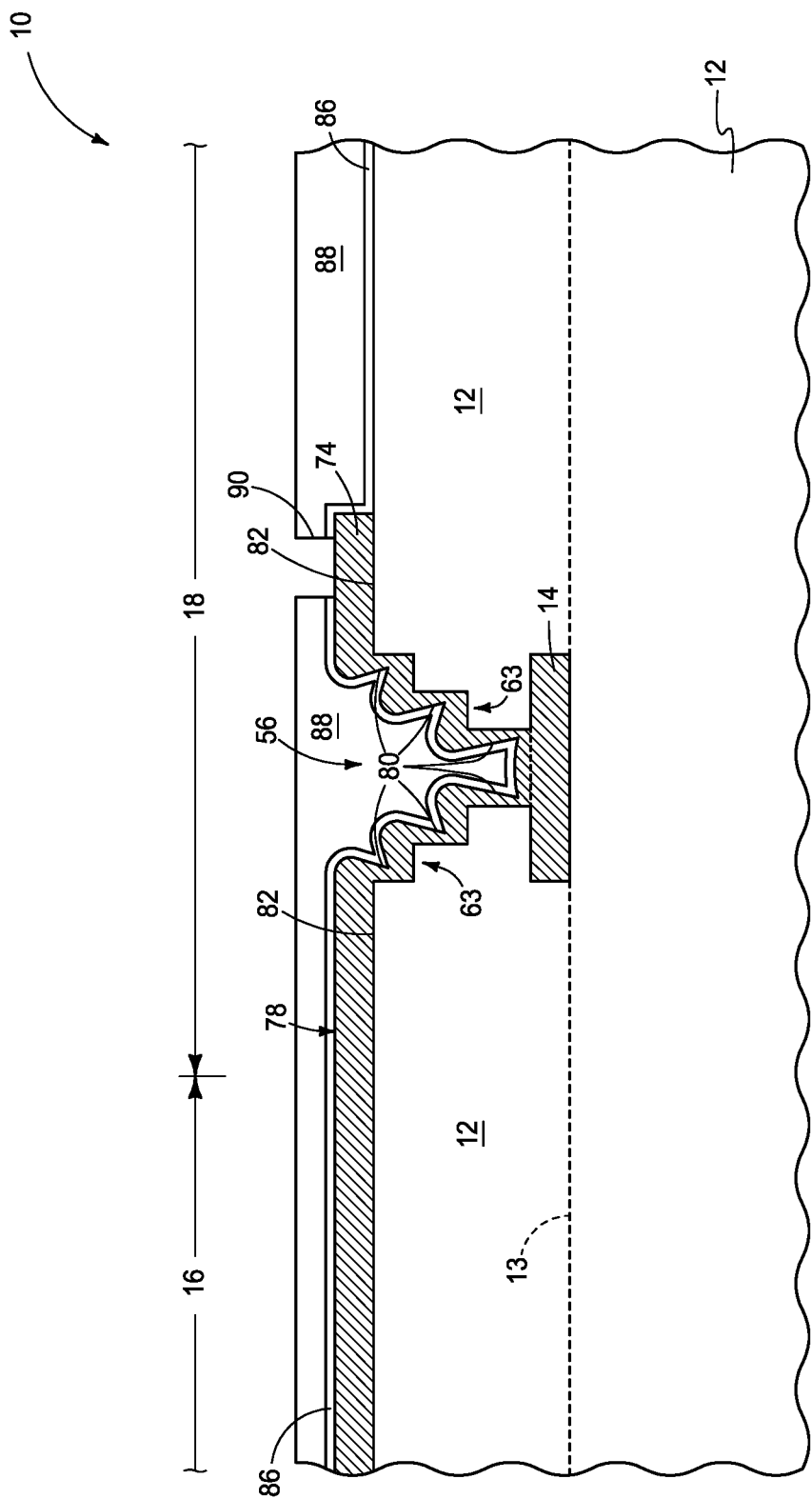
FIG. 15 is a view of the FIG. 14 substrate at a processing step subsequent to that shown by FIG. 14.

FIG. 14 shows subsequent example processing whereby a dielectric layer 86 (e.g., silicon nitride) has been formed as shown. FIG. 15 shows example subsequent processing wherein a dielectric layer 88 (e.g., polyimide) has been formed over dielectric layer 86, and which has been subsequently patterned to have an opening 90 there-through to RDL conductive line 78.

Figure 16:
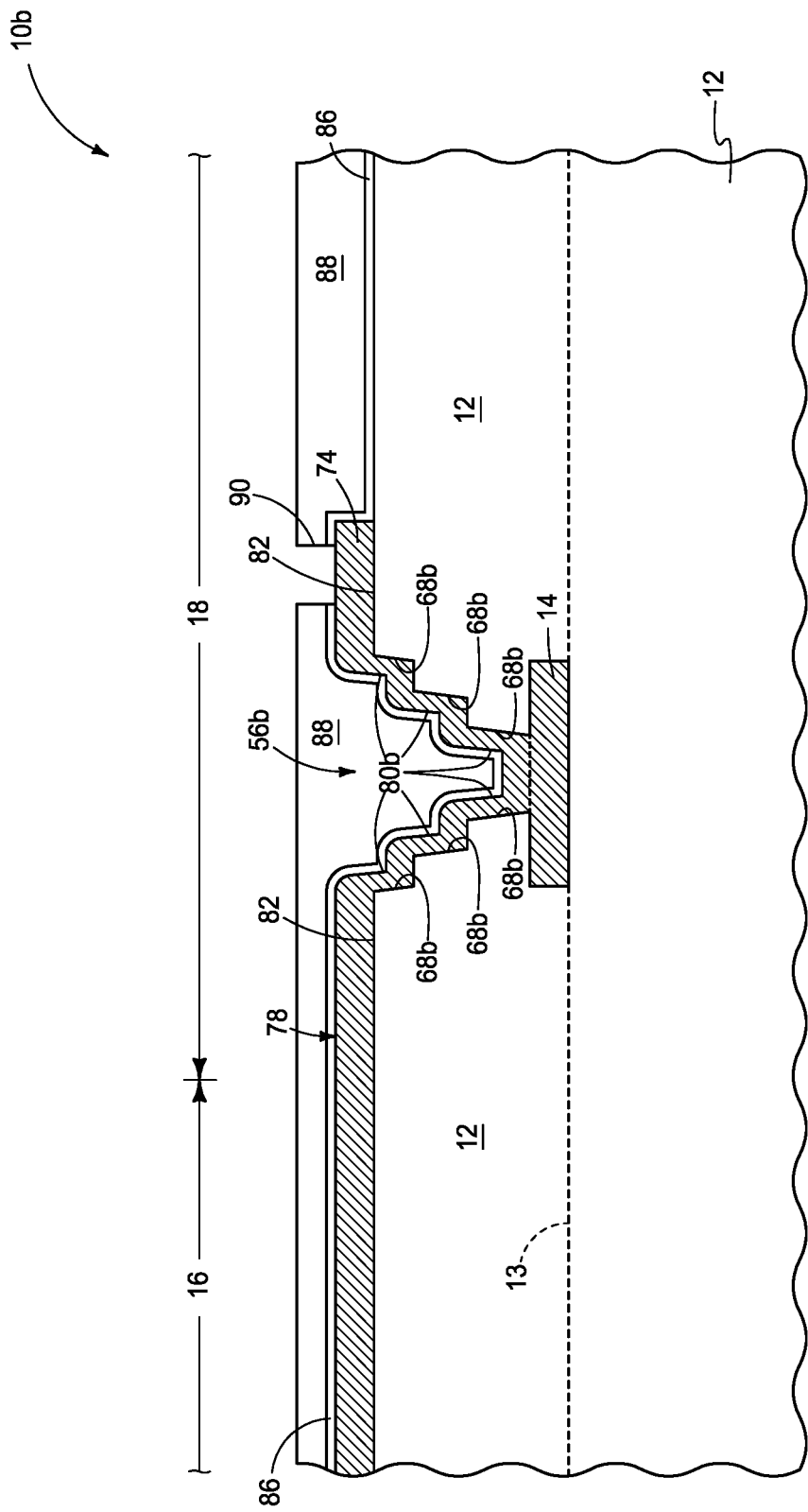
FIG. 16 is a diagrammatic cross-sectional view of a portion of a substrate construction in accordance with an embodiment of the invention.

In one embodiment, at least a majority (in one embodiment at least 90%, and in one embodiment all) of the sidewalls of the opening in the insulating material above and below the at least one annular ledge are straight linear in the vertical cross-section and are more than 5° from vertical. An example such embodiment is shown with respect to a substrate construction 10b in FIG. 16. Like numerals from the above-described embodiments have been used where appropriate, with some construction differences being indicated with the suffix "b". Example such sidewalls 68b of opening 56b above and below annular ledges 63 are straight linear in the vertical cross-section and by way example are shown as being 7.5° from vertical. Also, in one embodiment and as shown, angles of the respective straight-linear portions of laterally-inner surfaces 80b relative to planar upper surface 82 are acute. Any other attribute(s) or aspect(s) as shown and/or described herein with respect to other embodiments may be used.

Figure 17:
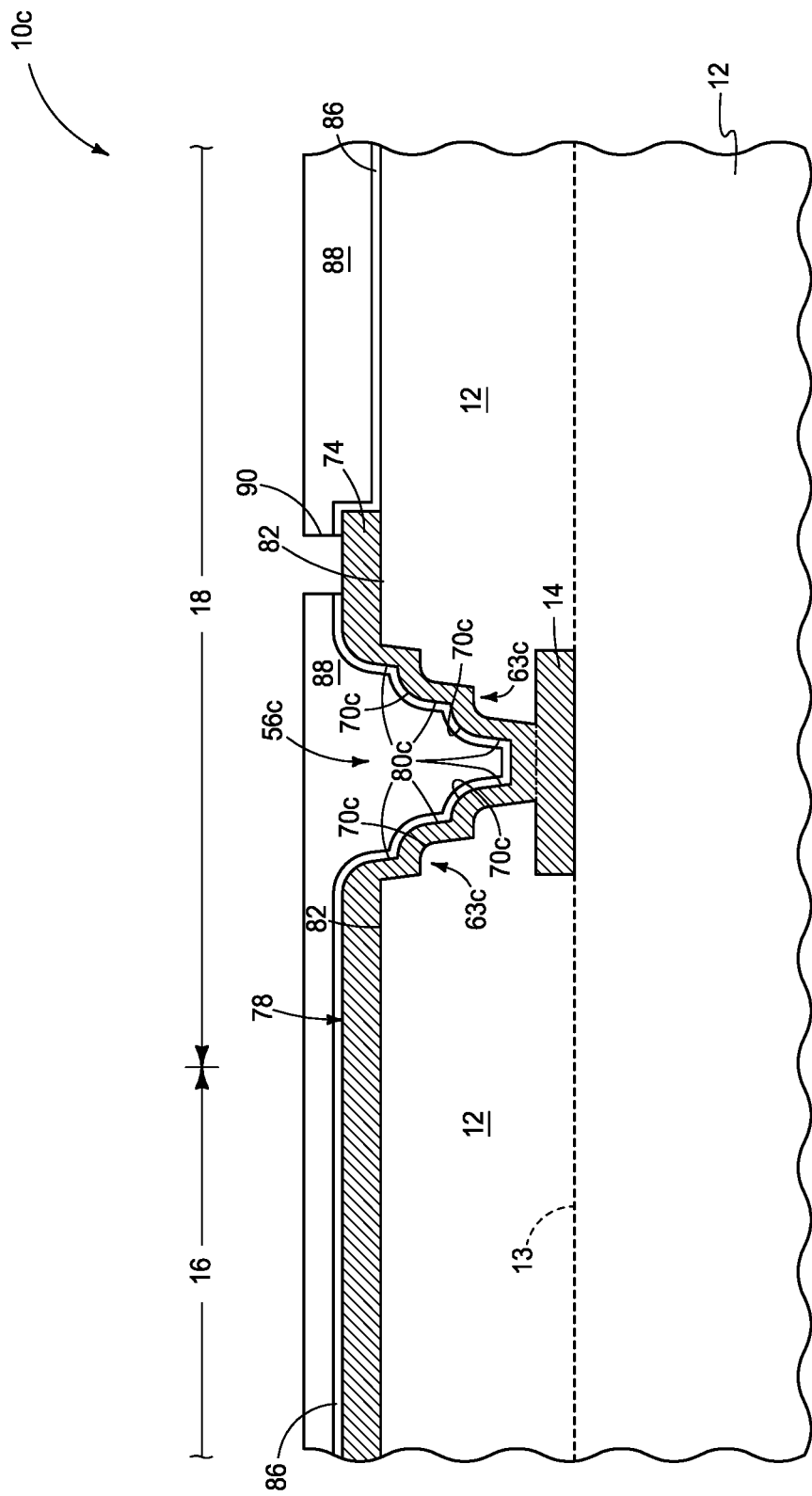
FIG. 17 is a diagrammatic cross-sectional view of a portion of a substrate construction in accordance with an embodiment of the invention.

In one embodiment, the at least one annular ledge has a radially-inner upper corner that is curved in the vertical cross-section, for example as shown in substrate construction 10c in FIG. 17. Like numerals from the above-described embodiments have been used where appropriate, with some construction differences being indicated with the suffix "c". Annular ledges 63c are shown as individually having a radially-inner upper corner 70c that is curved in the vertical cross-section. Any other attribute(s) or aspect(s) as shown and/or described herein with respect to other embodiments may be used.

Figure 18:
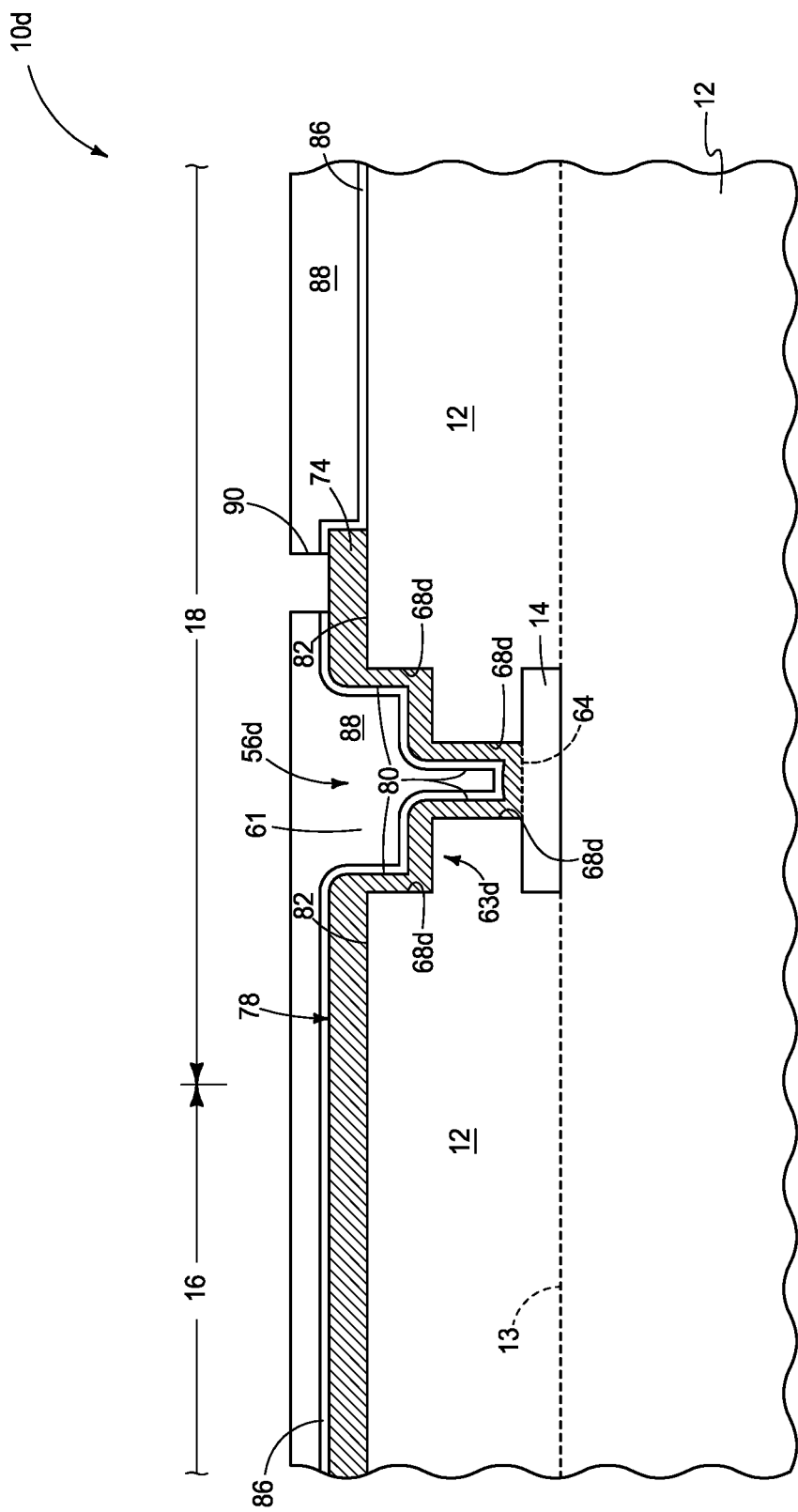
FIG. 18 is a diagrammatic cross-sectional view of a portion of a substrate construction in accordance with an embodiment of the invention.

FIG. 18 shows another example embodiment substrate construction 10d. Like numerals from the above-described embodiments have been used where appropriate, with some construction differences being indicated with the suffix "d". Opening 56d has only one annular ledge 63d elevationally between top 61 and bottom 64 of opening 56d. Opening sidewalls 68d above and below the one annular ledge 63 may have the same elevational lengths (not shown) or may have different elevational lengths (as shown), and in one such latter embodiment and as shown elevational length of the opening sidewall that is above the one annular ledge 63 is less than the elevational length of the opening sidewall

68*d* that is below the one annular ledge 63. Any other attribute(s) or aspect(s) as shown and/or described herein with respect to other embodiments may be used.

Embodiments of the invention encompass an integrated circuit structure (e.g., 10, 10*b*, 10*c*, 10*d*) independent of method of manufacture, yet which may be manufactured in accordance with any of the method aspects described above. Such an integrated circuit structure comprises insulating material (e.g., 12) above integrated circuitry. Such insulating material has an opening therein (e.g., 56, 56*b*, 56*c*, 56*d*) that extends elevationally inward to an upper conductive node (e.g., 14) of the integrated circuitry. The opening has at least one annular ledge (e.g., 63) elevationally between a top (e.g., 61) and a bottom (e.g., 64) of the opening. The integrated circuit structure includes a conductive line (e.g., 78) of an RDL (e.g., 74) above the insulating material. The RDL conductive line extends elevationally inward into the opening over the at least one annular ledge and is directly electrically coupled to the upper conductive node. Any other attribute(s) or aspect(s) as shown and/or described herein with respect to other embodiments may be used.

Embodiments of the invention may facilitate use of smaller size upper conductive nodes 14 (e.g., having smaller horizontal upper area thereof). Regardless, the example different profiles shown in FIGS. 8A and 8B may provide different features or attributes. For example, as shown in the embodiment of FIG. 8A where SH3 is the largest, likely over-etch of material 12 in forming opening 56 can be conducted to assure complete exposure of upper conductive node 14 at the base of opening 56 thus minimizing risk of creating a defect due to under-etch. This is so as risk of undesired widening of opening 56 due to such over-etch would likely only manifest at the bottom of opening 56, which is unlikely to be problematic. Yet, if RDL 74 is deposited by PVD, its shape may be more likely to result in an overhang as shown in FIG. 10 (e.g., having an obtuse angle as referred to above and sometimes known as a "bread-loafing" shape or effect). This may lead to higher resistance due to reduced lateral thickness of RDL 74, or even disconnection of such from node 14, at the bottom corners of opening 56 where such meets node 14 for larger SH3. This can be avoided by using an embodiment like FIG. 8B which has shorter SH3 which reduces impact from this reduced-lateral-thickness tendency if depositing by PVD.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or later-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, an integrated circuit structure comprises insulting material above integrated circuitry. The insulating material has an opening therein that extends elevationally inward to an upper conductive node of the integrated circuitry. The opening has at least one annular ledge elevationally between a top and a bottom of the opening. A conductive line of an RDL is above the insulating material. The RDL conductive line extends elevationally inward into the opening over the at least one annular ledge and is directly electrically coupled to the upper conductive node.

In some embodiments, an integrated circuit structure comprises insulting material above integrated circuitry. The insulating material has an opening therein that extends elevationally inward to an upper conductive node of the integrated circuitry. The opening has multiple annular ledges elevationally between a top and a bottom of the opening. A conductive line of an RDL is above the insulating material. The RDL conductive line extends elevationally inward into the opening over the multiple annular ledges and is directly electrically coupled to the upper conductive node. All conductive material of the RDL conductive line that is in the opening less-than-fills the opening.

In some embodiments, a method of forming an opening in a material comprises forming RIM over target material. Radiation is impinged onto the RIM through a masking tool over a continuous area of the RIM under which a target-material opening will be formed. The masking tool during the impinging allows more radiation there-through onto a mid-portion of the continuous area of the RIM in a vertical cross-section than onto laterally-opposing portions of the continuous area of the RIM that are laterally-outward of the mid-portion of the RIM in the vertical cross-section. After the impinging, the RIM is developed to form a RIM opening that has at least one pair of laterally-opposing ledges laterally-outward of the mid-portion of the RIM in the vertical cross-section elevationally between a top and a bottom of the RIM opening. The developed RIM is used as masking material while etching the target material through the RIM opening to form the target-material opening to have at least one pair of laterally-opposing ledges laterally-outward of a mid-portion in the target-material opening in the vertical cross-section elevationally between a top and a bottom of the target-material opening.

In some embodiments, a method of forming an opening in a material comprises forming RIM over target material. Radiation is impinged onto the RIM through a masking tool over a continuous area of the RIM under which a target-material opening will be formed. The masking tool during the impinging allows more radiation there-through onto a mid-portion of the continuous area than onto an annular portion of the continuous area that is peripheral to the mid-portion. After the impinging, the RIM is developed to form a RIM opening that has at least one annular ledge in the annular portion of the continuous area elevationally between a top and a bottom of the RIM opening. The developed RIM is used as masking material while etching the target material through the RIM opening to form the target-material opening to have at least one annular ledge radially-outward of a mid-portion in the target-material opening elevationally between a top and a bottom of the target-material opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method comprising:
   forming radiation-imageable material (RIM) over target material;
   impinging radiation onto the RIM through a masking tool over a continuous area of the RIM under which a target-material opening will be formed, the masking tool during the impinging allowing more radiation there-through onto a mid-portion of the continuous area of the RIM in a vertical cross-section than onto laterally-opposing portions of the continuous area of the RIM that are laterally-outward of the mid-portion of the RIM in the vertical cross-section;
   after the impinging, developing the RIM to form a RIM opening that has at least one pair of laterally-opposing ledges in the RIM laterally-outward of the mid-portion of the RIM in the vertical cross-section elevationally between a top and a bottom of the RIM opening;
   using the developed RIM as masking material while etching the target material through the RIM opening to form the target-material opening to have at least one pair of laterally-opposing ledges in the target material laterally-outward of a mid-portion in the target-material opening in the vertical cross-section elevationally between a top and a bottom of the target-material opening; and
   the masking tool has a mid-portion of a continuous area of the masking tool in a horizontal cross-section and has laterally-opposing portions of the continuous area of the masking tool that are laterally-outward of the mid-portion of the masking tool, the laterally-opposing portions of the continuous area of the masking tool having spaced elongated linear strips of radiation-blocking material and having an elongated radiation-transmissive region between immediately-adjacent ones of the spaced elongated linear strips in the horizontal cross-section.

2. The method of claim 1 wherein the spaced elongated linear strips and the radiation-transmissive regions are elongated straight linear in the horizontal cross-section.

3. A method comprising:
   forming radiation-imageable material (RIM) over target material;
   impinging radiation onto the RIM through a masking tool over a continuous area of the RIM under which a target-material opening will be formed, the masking tool during the impinging allowing more radiation there-through onto a mid-portion of the continuous area of the RIM in a vertical cross-section than onto laterally-opposing portions of the continuous area of the RIM that are laterally-outward of the mid-portion of the RIM in the vertical cross-section;
   after the impinging, developing the RIM to form a RIM opening that has two pairs of laterally-opposing ledges in the RIM laterally-outward of the mid-portion of the RIM in the vertical cross-section elevationally between a top and a bottom of the RIM opening;

using the developed RIM as masking material while etching the target material through the RIM opening to form the target-material opening to have two pairs of laterally-opposing ledges in the target material laterally-outward of a mid-portion in the target-material opening in the vertical cross-section elevationally between a top and a bottom of the target-material opening;

the masking tool has a mid-portion of a continuous area of the masking tool in a horizontal cross-section and has two sets of laterally-opposing portions of the continuous area of the masking tool that are laterally-outward of the mid-portion of the masking tool, a laterally-outer of the laterally-opposing portions of the continuous area of the two sets being laterally-outward of a laterally-inner of the laterally-opposing portions of the continuous area of the two sets, each of the laterally-opposing portions of the continuous area of the two sets of the masking tool having spaced elongated linear strips of radiation-blocking material and having a radiation-transmissive region between immediately-adjacent ones of the spaced elongated linear strips in the horizontal cross-section; and the radiation-transmissive regions being greater in number in the laterally-inner laterally-opposing portions of the two sets.

4. The method of claim 3 wherein the spaced elongated linear strips in each of the two sets have the same and constant width relative one another intra-set.

5. A method comprising:

forming radiation-imageable material (RIM) over target material;

impinging radiation onto the RIM through a masking tool over a continuous area of the RIM under which a target-material opening will be formed, the masking tool during the impinging allowing more radiation there-through onto a mid-portion of the continuous area of the RIM in a vertical cross-section than onto laterally-opposing portions of the continuous area of the RIM that are laterally-outward of the mid-portion of the RIM in the vertical cross-section;

after the impinging, developing the RIM to form a RIM opening that has two pairs of laterally-opposing ledges in the RIM laterally-outward of the mid-portion of the RIM in the vertical cross-section elevationally between a top and a bottom of the RIM opening;

using the developed RIM as masking material while etching the target material through the RIM opening to form the target-material opening to have two pairs of laterally-opposing ledges in the target material laterally-outward of a mid-portion in the target-material opening in the vertical cross-section elevationally between a top and a bottom of the target-material opening;

the masking tool has a mid-portion of a continuous area of the masking tool in a horizontal cross-section and has two sets of laterally-opposing portions of the continuous area of the masking tool that are laterally-outward of the mid-portion of the masking tool, a laterally-outer of the laterally-opposing portions of the continuous area of the two sets being laterally-outward of a laterally-inner of the laterally-opposing portions of the continuous area of the two sets, each of the laterally-opposing portions of the continuous area of the two sets of the masking tool having spaced elongated linear strips of radiation-blocking material and having a radiation-transmissive region between immediately-adjacent ones of the spaced elongated linear strips in the horizontal cross-section; and the radiation-transmissive regions being the same in number in the laterally-inner laterally-opposing portions of the two sets.

6. The method of claim 5 wherein, the spaced elongated linear strips in each of the two sets have the same and constant width relative one another intra-set; and the spaced elongated linear strips in each of the two sets have different width relative one another inter-set.

* * * * *